United States Patent [19]
Oyamada

[11] Patent Number: 5,946,191
[45] Date of Patent: Aug. 31, 1999

[54] ELECTRONIC DEVICE HAVING A PLUG-IN UNIT WITH A HEAT SINK STRUCTURE

[75] Inventor: Takashi Oyamada, Tokyo, Japan

[73] Assignee: NEC Corporation, Tokyo, Japan

[21] Appl. No.: 09/048,284

[22] Filed: Mar. 26, 1998

[30] Foreign Application Priority Data

Mar. 27, 1997 [JP] Japan ................................ 9-075227

[51] Int. Cl.⁶ ..................................................... H05K 7/20
[52] U.S. Cl. .................. 361/700; 165/104.33; 174/15.2; 361/719; 439/485
[58] Field of Search .......................... 174/15.2; 257/714, 257/715; 62/259.2; 439/485; 165/104.21–104.23, 104.33, 104.34, 80.3, 80.4, 185; 361/687, 699, 700, 717–719

[56] References Cited

U.S. PATENT DOCUMENTS

| | | |
|---|---|---|
| 4,366,526 | 12/1982 | Lijoi . |
| 5,343,358 | 8/1994 | Hilbrink . |
| 5,365,749 | 11/1994 | Porter . |
| 5,646,822 | 7/1997 | Bhatia . |
| 5,718,282 | 2/1998 | Bhatia . |

FOREIGN PATENT DOCUMENTS

| | | |
|---|---|---|
| 63-70447 | 3/1988 | Japan . |
| 2-58399 | 2/1990 | Japan . |
| 2-155296 | 6/1990 | Japan . |
| 2-79093 | 6/1990 | Japan . |
| 6-60190 | 8/1994 | Japan . |

*Primary Examiner*—Gerald Tolin
*Attorney, Agent, or Firm*—McGinn & Gibb, P.C.

[57] ABSTRACT

A heat sink structure for an electronic device of the type having a chassis and a plug-in unit provides efficient heat dissipation for a heat-generating component on a printed circuit board within the unit. In a preferred embodiment, a first heat pipe is fixedly attached to a heat dissipating plate for the heat generating component. At the opposite end, the first heat pipe is held by a connector plug attached to the unit. At one end, a second heat pipe is held by a plug-receiving seat that is fixedly attached to a backboard of the chassis. At the opposite end, the second heat pipe is fixedly attached to a heat dissipating portion on the chassis. The first heat pipe, plug, plug-receiving seat and second heat pipe transfer heat from the heat-generating component to the heat-dissipating portion.

3 Claims, 2 Drawing Sheets

ELECTRONIC DEVICE HAVING A PLUG-IN UNIT WITH A HEAT SINK STRUCTURE

FIELD OF THE INVENTION

The present invention relates generally to electronic devices and more particularly to a heat sink structure for a plug-in unit of an electronic device.

BACKGROUND OF THE INVENTION

JP-A 63-70447 discloses a heat sink structure for a unit structure having a printed circuit board with a heat generating electronic component. At its one end portion, a heat pipe is thermally coupled to the component and extends in a direction in which the printed circuit board is inserted. During the insertion, the heat pipe passes through an aperture a back panel of a chassis and then into apertures of heat dissipating spaced fins that are attached to the back panel. Spring portion thermally couples the heat pipe to the fins. The heat pipe transfers heat from the electronic component on the printed circuit board to the fins attached to the chassis.

JP-A (Utility Model) 2-79093 discloses another heat sink structure. In an electronic device of the type having a shelf and a printed circuit board with a heat generating electronic component, a heat pipe is thermally coupled with heat dissipating spaced fins that are disposed outside and attached to a top plate of the shelf and extends into the shelf. Within the shelf, the heat pipe extends perpendicularly to the inserting direction of the printed circuit board. A thermal coupler is thermally attached to the heat generating electronic component. When the printed circuit board is plugged into the shelf, the thermal coupler is thermally coupled with the heat pipe. The thermal coupler transfers heat from the heat generating electronic component to the heat pipe which in turn transfers the heat to the external heat dissipating fins.

SUMMARY OF THE INVENTION

An object of the present invention is to provide a heat sink structure for an electronic device of the type having a shelf and a plug-in unit, which provides efficient heat dissipation for heat generating component or components within the unit without hindering insertion of the unit into the shelf.

According to the present invention, there is provided a heat sink structure for an electronic device. According to the structure, there are provided:

a unit having a printed circuit board with a heat generating body;

a first heat pipe having a heat-receiving end portion thereof fixedly attached to and thermally coupled to said heat generating body, said first heat pipe having a heat-dissipating end portion;

a plug fixed to said unit and holding said heat-dissipating end portion of said first heat pipe, said first heat pipe being thermally coupled to said plug;

a chassis having a heat dissipating portion;

a plug-receiving seat on said chassis and adapted to receive said plug upon insertion of said unit into said chassis; and a second heat pipe having a heat-receiving end portion held by said plug-receiving seat and thermally coupled thereto, said second heat pipe having a heat-dissipating end portion thermally coupled to said heat-dissipating portion on said chassis.

DESCRIPTION OF THE PREFERRED EMBODIMENT

Figure 1:
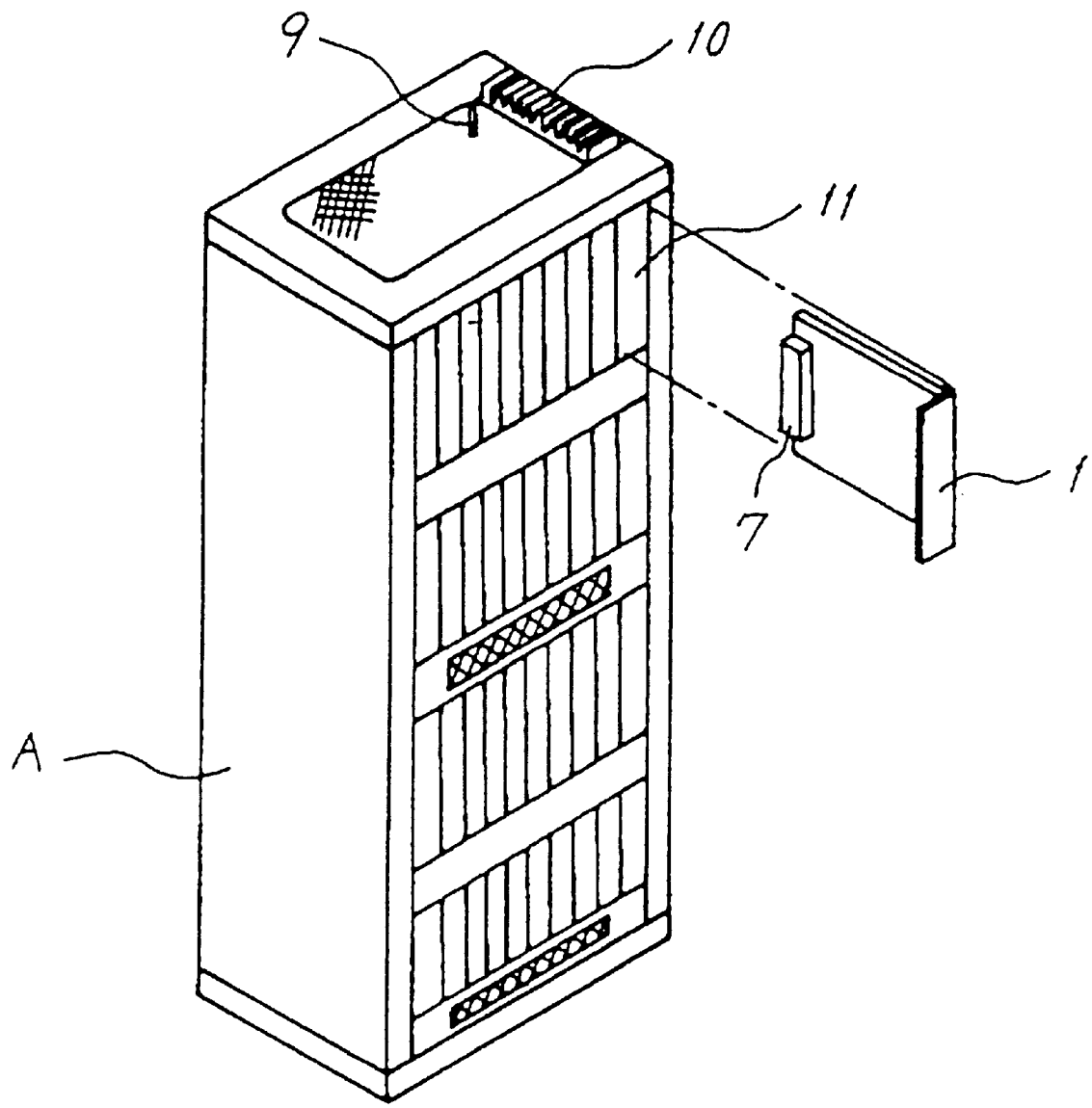
FIG. 1 Is a perspective view of an electronic device of the type having a shelf and a plug-in unit.

Referring to FIG. 1, the reference character A denotes an electronic device of the type having a shelf 11 and a plug-in unit 1. A heat-dissipating portion 10 is attached to the shelf 11 of the electronic device A and exposed to the environment. At its heat-dissipating end, a heat pipe 9 is thermally coupled to the heat-dissipating portion 10. The heat pipe 9 extends from the heat-dissipating portion 10 into the shelf 11 toward a backboard 2 of the shelf 11 (see FIG. 2).

Figure 2:
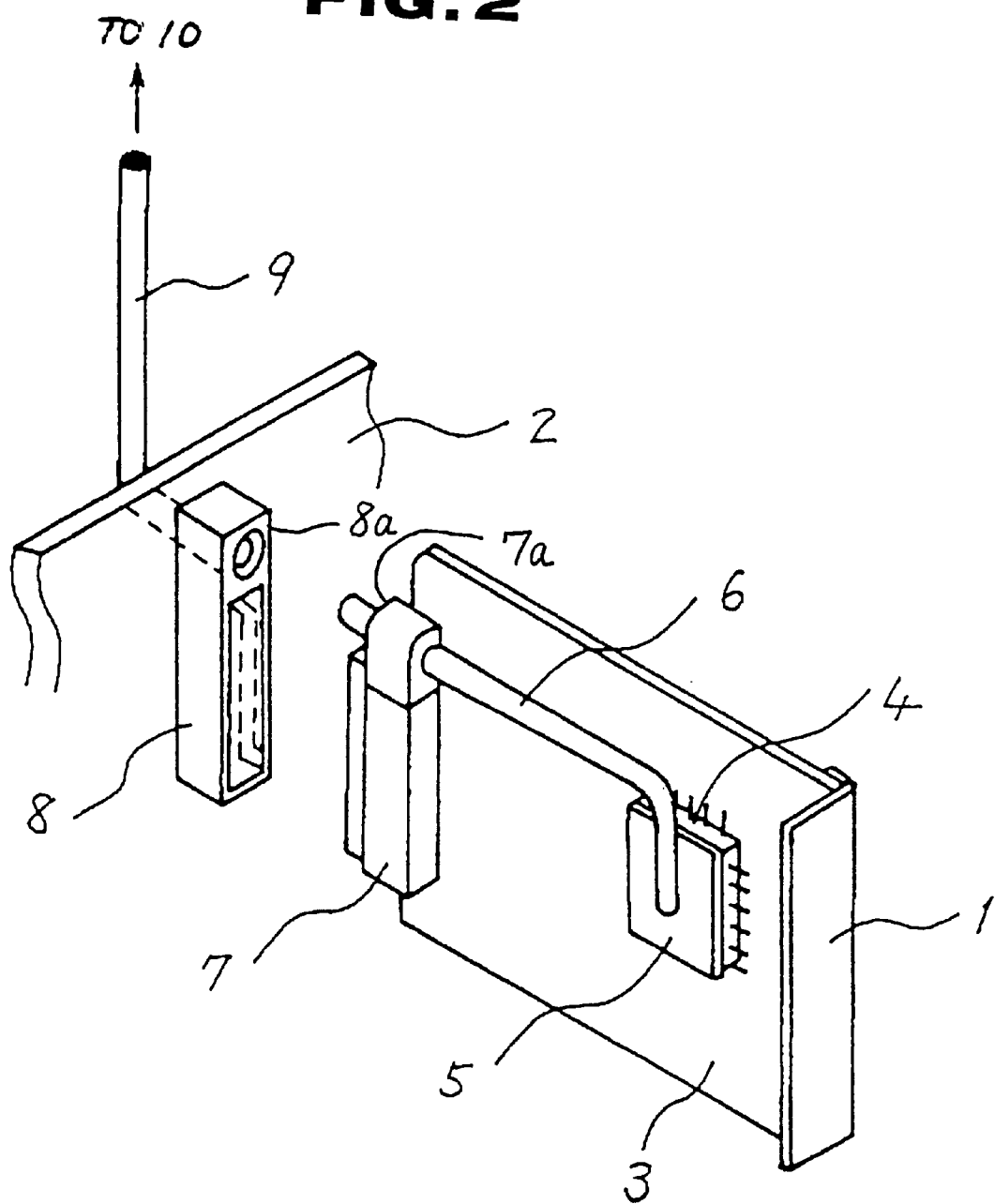
FIG. 2 illustrates schematically the plug-in unit that is about to be thermally coupled with a portion of the shelf.

Referring also to FIG. 2, attached to the backboard 2 is a plug-receiving seat 8. At its heat-receiving end portion, the heat pipe 9 is thermally coupled to the plug-receiving seat 8. The unit 1 has a printed circuit board 3. Disposed on the printed circuit board is a heat-generating body or electronic component 4 having a heat dissipating plate 5. A heat pipe 6 is fixedly attached to the unit 1. At its heat-receiving end portion, the heat pipe 6 is fixedly attached to and thermally coupled to the heat dissipating plate 5. At its heat-dissipating end portion, the heat pipe 6 is inserted into and thermally coupled to a connector plug 7 that is fixedly attached to the unit 1.

When the unit 1 is adequately inserted into an opening of the shelf 11, the plug-receiving seat 8 receives the plug 7. In this position, the plug 7 and the plug-receiving seat 8 are firmly engaged with each other through their mutually facing flat surface portions 7a and 8a. The flat surface portions 7a and 8a transfer heat from the heat-dissipating end portion of the heat pipe 6 to the heat-receiving end portion of the heat pipe 9. Thus, the heat pipe 6, plug 7, plug-receiving seat 8 and heat pipe 9 transfer heat from the electronic component 4 to the heat-dissipating portion 10.

Preferably, the plug 7 and plug-receiving seat 8 are constructed to transmit electric signals between them in addition to the transfer of thermal energy.

From the preceding description, it is now understood that the heat pipe 6 is fixedly attached to the unit 1 with its one end connected to the heat-dissipating plate 5 and the opposite end portion fixedly received by the plug 7 that is attached to the unit 1. This allows any desired layout of the heat pipe 6 without any interference of electronic components on the printed circuit board 3. Besides, the heat pipe 6 is fixedly attached to the circuit board 3 at the plug 7 so that no undesired mechanical stress is imparted to the heat generating electronic component 4.

What is claimed is:

1. In an electronic device:

a unit having a printed circuit board with a heat generating body;

a first heat pipe having a heat-receiving end portion thereof fixedly attached to and thermally coupled to said heat generating body, said first heat pipe having a heat-dissipating end portion;

a plug fixed to said unit and holding said heat-dissipating end portion of said first heat pipe, said first heat pipe being thermally coupled to said plug;

a chassis having a heat dissipating portion;

a plug-receiving seat on said chassis and adapted to receive said plug upon insertion of said unit into said chassis; and a second heat pipe having a heat-receiving end portion held by said plug-receiving seat and thermally coupled thereto, said second heat pipe having a heat-dissipating end portion thermally coupled to said heat-dissipating portion on said chassis.

2. An electronic device as claimed in claim 1, wherein said plug and said plug-receiving seat have mutually facing flat surface portions for transfer of thermal energy between said heat-dissipating end portion of said first heat pipe and said heat-receiving receiving end portion of said second heat pipe.

3. An electronic device as claimed in claim 1, wherein said plug and said plug-receiving seat are constructed to transfer electric signals.

* * * * *